(12) United States Patent
Kurzeja et al.

(10) Patent No.: US 10,582,610 B2
(45) Date of Patent: Mar. 3, 2020

(54) CONDUCTOR PATH STRUCTURE HAVING A COMPONENT RECEIVED IN A VIBRATION-DAMPED MANNER

(71) Applicant: Possehl Electronics Deutschland GmbH, Niefern (DE)

(72) Inventors: Dietmar Kurzeja, Niefern (DE); Frédéric Morgenthaler, Niefern (DE)

(73) Assignee: POSSEHL ELECTRONICS DEUTSCHLAND GMBH, Niefern (DE)

( * ) Notice: Subject to any disclaimer, the term of this patent is extended or adjusted under 35 U.S.C. 154(b) by 0 days.

(21) Appl. No.: 15/976,128

(22) Filed: May 10, 2018

(65) Prior Publication Data

US 2018/0263112 A1  Sep. 13, 2018

Related U.S. Application Data

(63) Continuation of application No. PCT/EP2016/001870, filed on Nov. 10, 2016.

(30) Foreign Application Priority Data

Nov. 12, 2015 (DE) .................. 10 2015 014 593
Nov. 12, 2015 (DE) .................. 20 2015 007 798 U (51) Int. Cl.
*H05K 1/02* (2006.01)
*H05K 1/14* (2006.01)
(Continued)

(52) U.S. Cl.
CPC ......... *H05K 1/0271* (2013.01); *B81B 7/0016* (2013.01); *B81B 7/0048* (2013.01);
(Continued)

(58) Field of Classification Search
CPC .... H05K 1/0271; H05K 1/181; B81B 7/0016; G01P 1/003
See application file for complete search history.

(56) References Cited

U.S. PATENT DOCUMENTS 3,160,549 A * 12/1964 Caldwell ............... B32B 27/00
181/207
5,407,034 A * 4/1995 Vydra .................... B32B 15/08
188/73.37
(Continued)

FOREIGN PATENT DOCUMENTS

DE  10 2012 201 486 A1  8/2013
EP  2 789 578 A2  10/2014
(Continued)

*Primary Examiner* — Hoa C Nguyen
(74) *Attorney, Agent, or Firm* — Hackler Daghighian Martino & Novak (57) ABSTRACT

A conductor path structure has a damping device for an oscillation-damped and/or vibration-damped (electronic, electromechanical, micromechanical) component. The conductor path structure has a first base body made of a carrier material including a connection area for receiving the component. The connection area is arranged separated from an area of the first base body surrounding it and is arranged oscillation-damped and/or vibration damped and co-acting with an intrinsic damping device of the conductor path structure. The conductor path structure includes a second base body arranged at a distance under the first base body, wherein above the second base body of the conductor path structure at least one adhesive layer of a damping material is provided. The intrinsic damping device is formed by said at least one adhesive layer arranged between the connection area of the first base body and the area of the second base body arranged below the connection area.

9 Claims, 11 Drawing Sheets

(51) Int. Cl.
*H05K 1/18* (2006.01)
*H05K 3/20* (2006.01)
*B81B 7/00* (2006.01)
*G01P 1/00* (2006.01)
*H01L 23/498* (2006.01)

(52) U.S. Cl.
CPC .............. *G01P 1/003* (2013.01); *H05K 1/142* (2013.01); *H05K 1/181* (2013.01); *H05K 3/202* (2013.01); *B81B 2201/0235* (2013.01); *H01L 23/49861* (2013.01); *H01L 2224/16225* (2013.01); *H05K 2201/0133* (2013.01); *H05K 2201/0187* (2013.01); *H05K 2201/049* (2013.01); *H05K 2201/09036* (2013.01); *H05K 2201/09227* (2013.01); *H05K 2201/10083* (2013.01); *H05K 2201/10151* (2013.01); *H05K 2201/10378* (2013.01); *H05K 2201/10674* (2013.01); *H05K 2201/10734* (2013.01); *H05K 2201/2045* (2013.01); *Y02P 70/611* (2015.11)

(56) References Cited

U.S. PATENT DOCUMENTS

| | | | |
|---|---|---|---|
| 5,552,209 A * | 9/1996 | McCutcheon | H05K 1/0271 428/209 |
| 5,842,686 A * | 12/1998 | Hansen | F16F 9/306 267/140 |
| 6,399,896 B1 | 6/2002 | Downes et al. | |
| 2008/0260181 A1 | 10/2008 | Bowen | |

FOREIGN PATENT DOCUMENTS

| | | |
|---|---|---|
| WO | 96 04772 A1 | 2/1996 |
| WO | 2008 142918 A1 | 11/2008 |
| WO | 2011 089066 A1 | 7/2011 |

\* cited by examiner

CONDUCTOR PATH STRUCTURE HAVING A COMPONENT RECEIVED IN A VIBRATION-DAMPED MANNER

CROSS-REFERENCE TO RELATED APPLICATIONS

This continuation application claims priority to PCT/EP2016/001870 filed on Nov. 10, 2016 which has published as WO 2017/080657 A1 and also the German application number 10 2015 014 593.2 filed on Nov. 12, 2015 and the German application number 20 2015 007 798.6 filed on Nov. 12, 2015, the entire contents of which are fully incorporated herein with these references.

DESCRIPTION

Field of the Invention

The invention relates to a conductor path structure comprising a damping device for a component, in particular an electronic or an electromechanical component.

Background of the Invention

Conductor path structures comprising an electronic or electromechanical component, in particular with a micromechanical component such as a micromechanical sensor device, are often used in installation environments in which the circuit board and/or the component mounted on it are exposed to vibrations, which can lead to malfunctions. An example therefore is an acceleration sensor, which is used, for example, in the automotive sector in a plurality of vehicles. It is therefore necessary to mount the sensor provided on the printed circuit board in a vibration-damped manner, so that oscillations and/or vibrations resulting from the installation environment are not transmitted to the sensor or are transmitted only in a damped manner.

A damping device for a micromechanical sensor device is known from DE 10 2012 20 486 A1, which is intended to serve for keeping away disturbing vibrations from a sensitive sensor element of the sensor device. For this purpose, the damping device known from the aforementioned publications provides that the damping device has an intermediate layer device made of a printed circuit board material, which is divided by a resilient device in a centrally arranged first section and in a second section which surrounds the first section in a ring-like manner. In this way, a lateral distance between the two mentioned sections is formed. Contact elements are arranged on the underside of the second section, which also function as spacer elements, which form a distance between the circuit board carrying the damping device and the intermediate layer device of the damping device. In this way an overall system, which is oscillatingly mounted, is formed by means of the intermediate layer device, which can dampen harmful vibrations and oscillation influences on the sensor device being arranged on the first section of the intermediate layer device.

According to a further embodiment of the damping device known from the aforementioned document, damping materials are provided in the area of the resilient device of the first intermediate layer device. These are preferably an elastomer, for example a silicone elastomer or a silicone gel, a gel with fillers, for example sand-like fillers or foam-like materials. The function of this elastic damping material mainly consists in optimizing the quality of the spring-mass system of the damping device. The damping material can be applied before contacting and soldering in a separate process step, for example by spraying, injection moulding, injection pressing, printing or dispensing, whereby—according to the representation of the aforementioned document—the process chain and the production method for the first intermediate layer of the damping device are simplified.

A disadvantage of the known procedure is that it is very cost-intensive: The first section has to be cut free from the second section which surrounds it in a ring-like manner, for example by means of a laser technique, and between the first section and the second section of the intermediate layer device, the resilient device must then be arranged. As known, this is complex. In order to improve the vibration damping, is provided—as described above—in the known damping device that damping materials such as silicone or the like still have to be injection-molded after the two sections have been separated and connected by the resilient device. A further disadvantage of the damping device described above is that it requires a high structural height of the conductor path structure using them.

WO 2011/089066 A1 describes a sensor device having a flexible circuit board having a fastening section for a chip structure and a damping element for damping the chip structure from mechanical influences, wherein the fastening section of the flexible circuit board, the chip structure and the damping element are arranged together over each other. The sensor device known from said document therefore consists of a single base body being formed by the flexible circuit board, which comprises an area for carrying the chip structure, said area therefore is an integral part of the circuit board. The circuit board then is bent in such a way that the fastening section is arranged on top and a further rigid section is arranged at the bottom. Between these two sections then the damping element is inserted.

2008/260181 A1 describes a carrier body having a vibration-damped section, which is intended to damp oscillations running from a first area of the base body to said second area. On the vibration-damped section an electronic component is arranged. It can be provided that between the first and the second area a vibration damping material is arranged.

WO 2008/142918 A1 describes a structure having a plurality of conductor paths each carrying an electronic component. Between these conductor paths layers made of a damping material are arranged.

U.S. Pat. No. 6,399,896 B1 describes an arrangement in which an electronic component is mounted on a chip carrier. The chip carrier in turn is mounted via pads and solder balls on a conductor path and the afore-mentioned solder balls are in turn mounted on a metallic layer.

EP 2 789 578 A2 describes a component having a substrate structure consisting of a first plane of a substrate and a second plane of a substrate, wherein the first plane comprises a first partial area movable mounted relative to the second plane and a second partial area mechanically and/or electrically connected to the second plane. Between these two partial areas resilient structures are formed from the first plane, wherein between the first and the second plane a cavity for allowing a relative movement between the first partial area of the first plane and the second partial area is arranged.

WO 96/04772 A1 describes a conductor path structure, in which between two base bodies a damping layer is provided.

It is the object of the present invention to provide a conductor path structure with an intrinsic damping device for a component, in particular an electronic or electromechanical, in particular a micromechanical component, in such a way that, in a simple manner, a reduction of the oscillations and/or vibrations acting on the aforementioned component can be achieved.

SUMMARY OF THE INVENTION

This object is solved according to the invention by a conductor path structure according to the features of the independent claims.

By means of the measures according to the invention, a conductor path structure having an intrinsic damping device for an electronic or electromechanical component is advantageously formed, which is distinguished by a simple and thus cost-effective producibility. In an advantageous manner, it is no longer necessary to form the intrinsic damping device to separate the connection area of the conductor path structure carrying the aforementioned component by cutting and then to connect this connection area with the remaining area of the base body by means of an elastically resilient device, which is complicated in its production and expensive. Rather, the conductor path structure according to the invention provides that the intrinsic damping device is formed by one or more layers made of a damping material. Such a measure has not only the aforementioned advantages, but a conductor path structure equipped with an intrinsic damping device designed in this way is characterized by a low overall height.

An advantageous embodiment of the invention provides that a damping adhesive is used as the damping material.

A further advantageous embodiment of the invention provides that a rigid adhesive layer is provided. Such a measure has the advantage that in this way the conductor path structure can be stabilized in a simple manner.

Further advantageous embodiments of the invention are the subject matter of the dependent claims.

BRIEF DESCRIPTION OF THE DRAWINGS

Further details and advantages of the invention are disclosed in the exemplary embodiments, which are described below on the basis of the Figures. It shows.

DETAILED DESCRIPTION OF THE PREFERRED EMBODIMENTS

Figure 1:
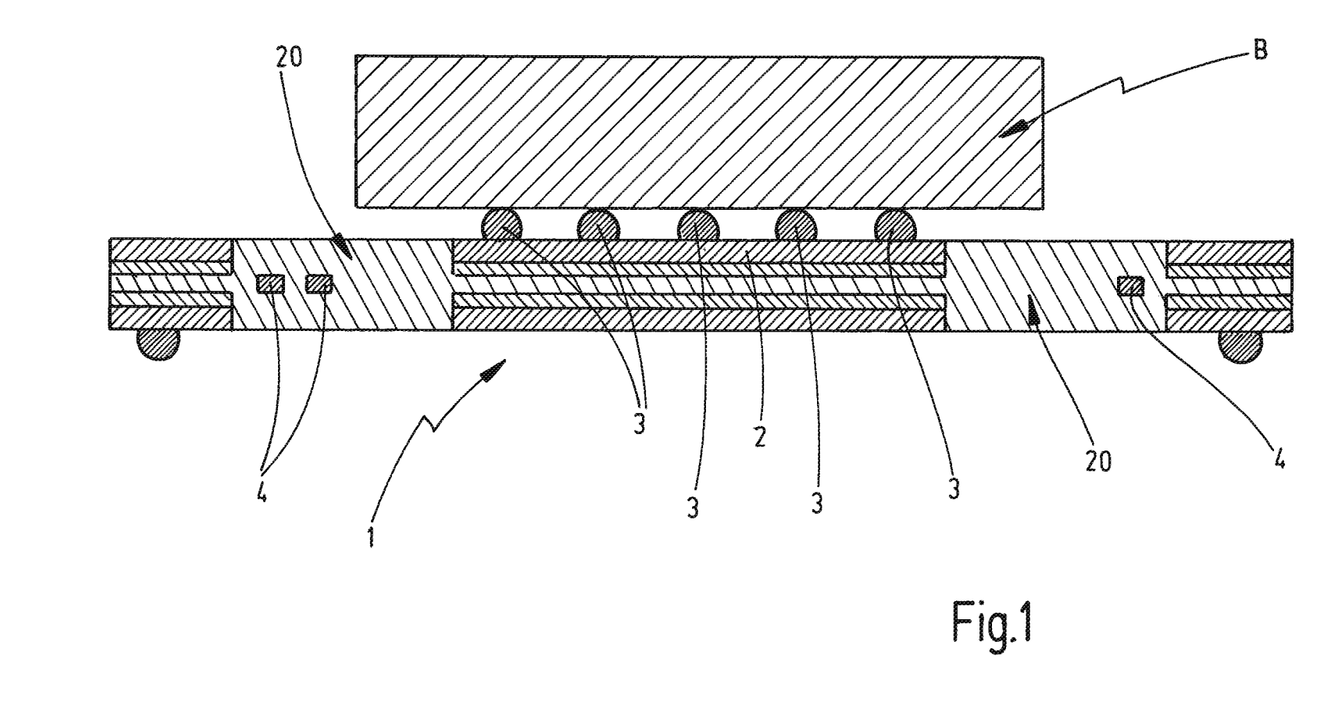
FIG. 1 is a schematic illustration of a printed circuit board with a component mounted on it.

FIG. 1 shows a schematic view of a conductor path structure 1, which comprises an electronic and/or electromechanical, in particular a micromechanical component B, such as an acceleration sensor or the like. The component B is arranged on a connection area 2 of the conductor path structure 1, which is designed here as a so-called rewiring carrier for the component B. The connection area 2 is arranged in a vibration-decoupled manner relative to the area of the conductor path structure 1 surrounding it, so that an intrinsic damping is formed. It is to be noted that here as well as in the following the term "vibration-decoupled" or a synonymous expression does not only refer to a complete decoupling, but is also to be understood to mean a partial decoupling of oscillations and/or vibrations in the sense of a damping.

The component B is electrically connected to conductor tracks 4 of the conductor path structure 1 by connection elements 3, wherein—as shown in FIG. 1—by means of these connection elements 3 a distance between the component B and the surface of the connection area 2 of the conductor path structure 1 is formed.

A damping device 20 is arranged between the connection area 2 carrying the component B and the remaining part of the conductor path structure 1. Exemplary embodiments of such a damping device are described in the following exemplary embodiments. In the embodiments shown, the damping device 20 is formed by at least one oscillation- and/or vibration-damping material layer, in particular an adhesive layer.

Figure 2:
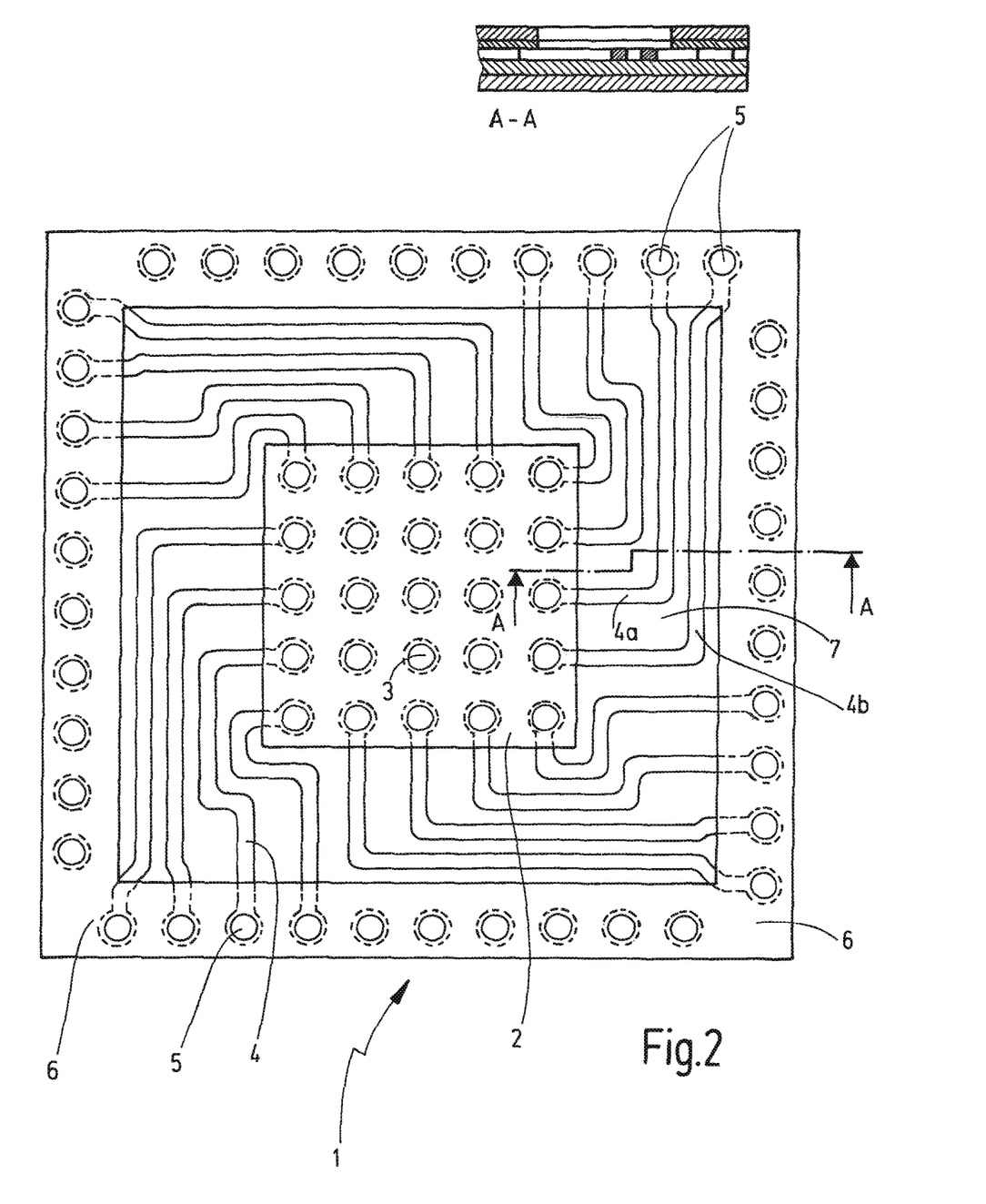
FIG. 2 is a first exemplary embodiment of a conductor path structure.
Figure 3:
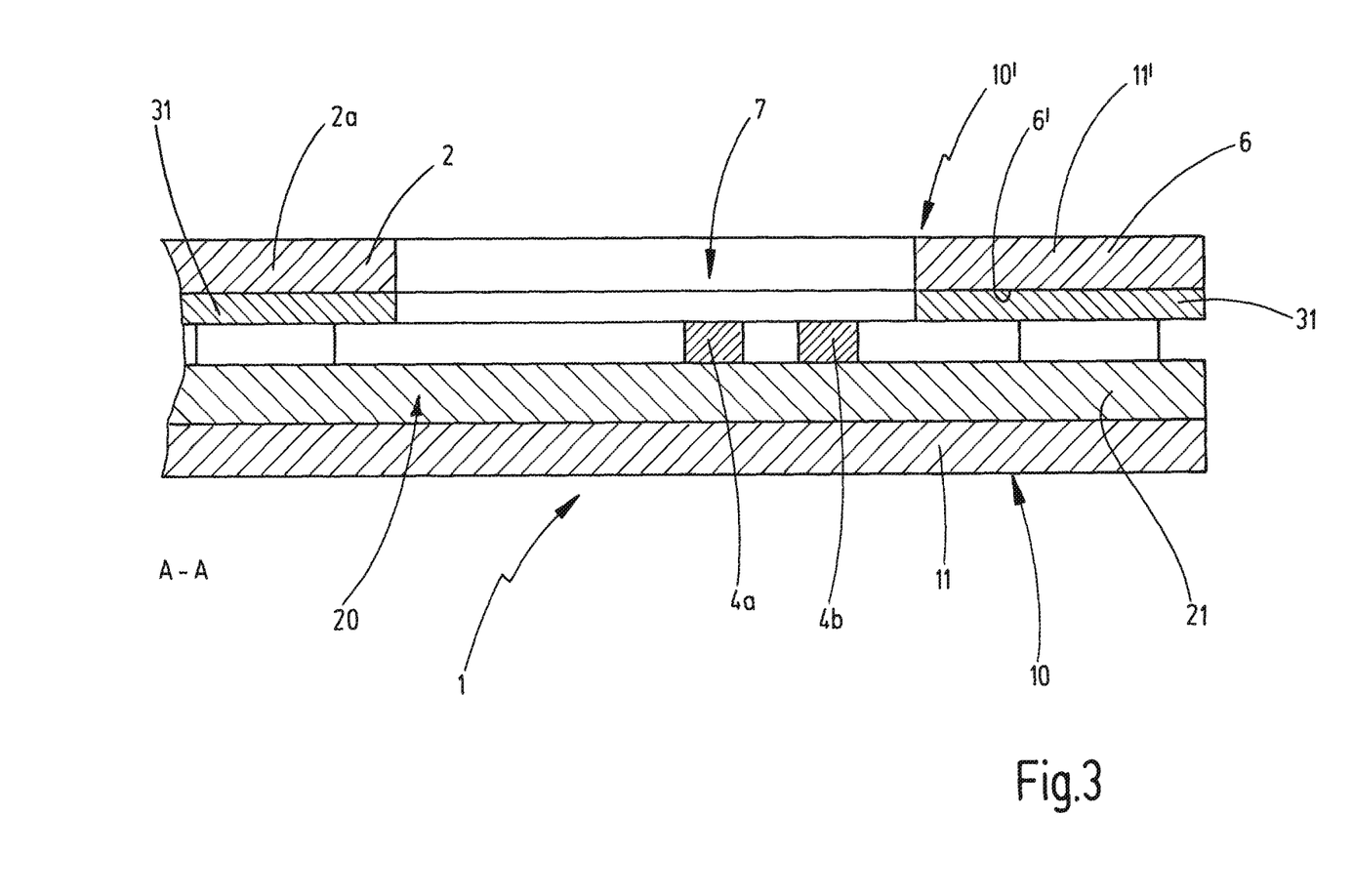
FIG. 3 is an enlarged representation of a section through the first embodiment along the line A-A.

FIGS. 2 and 3 show a first exemplary embodiment of a conductor path structure 1 having an intrinsic damping device 20. For the sake of an easier representation, the component shown in FIG. 1 have been omitted in the aforementioned Figures as well as in the following Figures. FIG. 2 thus shows a top view of the conductor path structure 1 and FIG. 3 shows an enlarged representation of a section along the line A-A of FIG. 2. For the sake of better orientation, FIG. 2 shows the section of FIG. 3 on the right top to scale, so that the spatial positional relationship between the structures visible in FIG. 3 and those of FIG. 2 can be seen.

FIGS. 2 and 3 show the connection area 2 carrying the component B—not shown in these Figures—which is provided with the aforementioned connection elements 3 for the component B. These are connected with the conductor path structure 1 via conductor paths 4 having contact elements 5, which are arranged in the border area 6 of the conductor path structure 1. Such a design of a conductor path structure 1 is known and hence needs not to be described further.

The structure of the conductor path structure 1 is best seen from FIG. 3 in more details, which—as described above—represents a sectional view along the line A-A of FIG. 2. In particular, the conductor tracks 4a and 4b of FIG. 2 and the border area 6 of the conductor path structure 1 and the connection area 2 for the component B can be seen here.

The conductor path structure 1 has a lower base body 10 made of a suitable carrier material 11, in particular a laminate. Furthermore, a layer 21 made of a damping material, in particular of a damping adhesive, is arranged above it, which functions as the intrinsic damping device 20 of the conductor path structure 1.

On the layer 21 the conductor tracks 4, consequently the conductor tracks 4a and 4b too, are arranged. Above that plane receiving the conductor tracks 4, 4a, 4b of the conductor path structure 1 an upper base body 10' is arranged, which is formed by a carrier material 11', in particular a laminate, and which carries on its underside a layer of a rigid adhesive 31. In FIG. 3—according to the section along the line A-A of FIG. 3—the border area 6 as well as a part of the connection area 2 is shown. In this case too, the upper base body 10' is formed by a carrier material 11', in particular a laminate. Below thereof a layer 31 of a rigid adhesive is arranged.

The rigid adhesive layer 31 serves to stabilize the conductor path structure 1 and to provide a sufficient connection between corresponding areas of the carrier material 11' of the base body 10' and the layer 21 formed by the damping material. The person skilled in the art is aware that this layer 31 made of rigid adhesive can be omitted, when the adhesive properties of the material forming the layer 21 allows a connection between the printed circuit board areas 2a, 6 and that adhesive.

As can best be seen from FIG. 3, a free space 7 is provided between the border area 6 and the connection area 2, so that there is no mechanical connection between this border area 6 and the connection area 2. The connection area 2 is thus mounted on the damping layer 21 capable of oscillation and/or vibration. This has the consequence that oscillations and/or vibrations impinging on the conductor path structure 1 are transmitted to the connection area 2 not or only in a damped manner.

In order to produce the conductor path structure 1 shown in FIGS. 2 and 3, firstly the damping layer 21 of the intrinsic damping device 20 is applied to the carrier material 11. Then a lead frame containing conductor tracks 4, 4a, 4b, is applied onto said layer 21. Then the carrier material forming the border area 6 and the connection area 2 is applied, if necessary with the layer 31 made of a rigid adhesive arranged on its underside. However, it is also possible that firstly a partial structure of the lead frame structure 1, comprising the carrier material 11, the layer 21 and the conductor tracks 4, 4a, 4b, is applied on the layer 31 of a rigid adhesive and then on this layer 31 the carrier material 11 of the border area 6 as well as the one of the connection area 2 are applied. Of course, it is also possible to "reverse" the afore-described manufacturing of the conductor path structure 1, i.e. in the representation of FIGS. 2 and 3, to start from top, to form the border area 6 and the connection area 2 first and to apply the further structural components of the conductor path structure 1 as described before, but in a "reversed order".

The described design of the conductor path structure 1 is characterized by the fact that it is no longer necessary to cut out individual areas of a carrier body and to provide a resilient device acting as a damping device between them, as is the case of the known design. The conductor path structure 1 described is thus distinguished by its simple and thus cost-effective producibility and a low build-up height.

Figure 4:
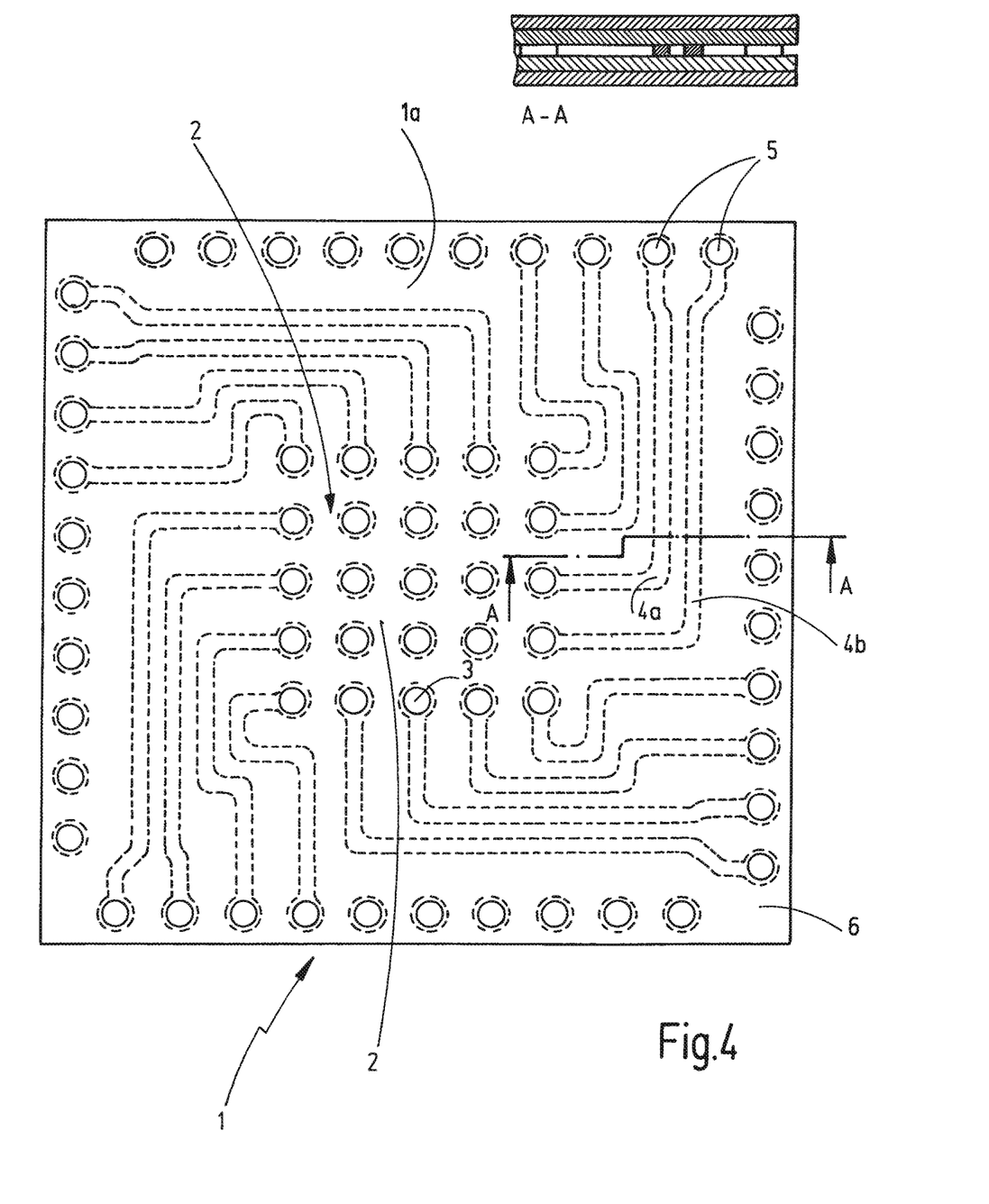
FIG. 4 is a second exemplary embodiment of a conductor path structure.
Figure 5:
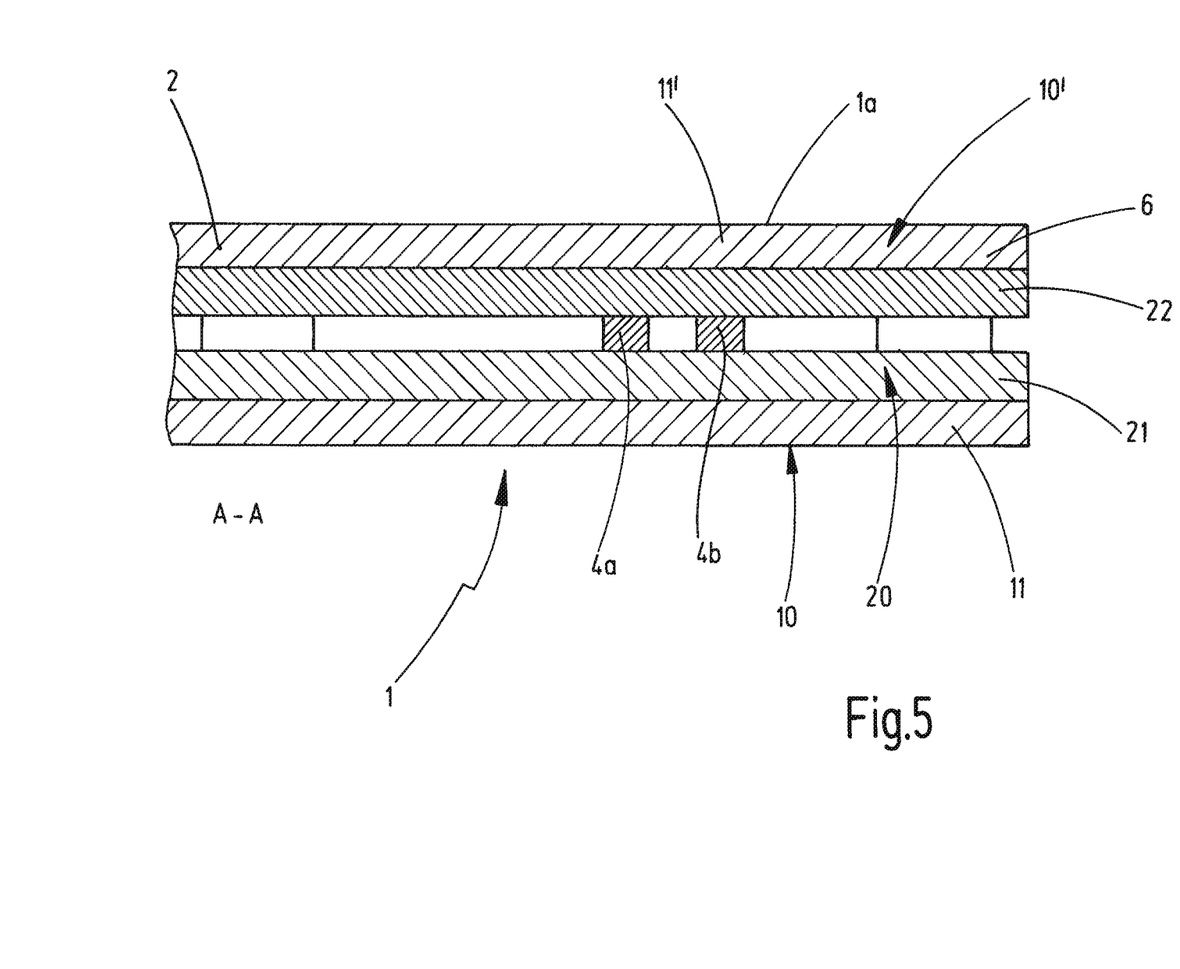
FIG. 5 is an enlarged representation of a section through the second embodiment along the line A-A.

FIGS. 4 and 5 show a second exemplary embodiment of such a conductor path structure 1, wherein corresponding components are provided with the same reference symbols and are no longer described in more detail. The layered structure of the conductor path structure 1 of FIG. 4 in turn can be seen in the sectional view of FIG. 5. The essential difference between the first and second exemplary embodiments is now, as it also can also be seen from the top view of FIG. 4, the conductor path structure 1 of the second exemplary embodiment has a closed surface 1a. This can also be seen therefrom, that in FIG. 4—in contrast to FIG. 2—the conductor tracks 4, 4a, 4b are—since not visible—shown in dashed lines. From FIG. 5, it can be seen again, that the conductor path structure 1 has a lower base body 10 made of an appropriate carrier material 1, in particular a laminate, above which the layer 21, which acts as an intrinsic damping device 20, made of a damping material, in particular an adhesive is arranged. The latter carries the conductor tracks 4, 4a, 4b. Above the conductor tracks 4, 4a, 4b a further layer 22 made of a damping adhesive, is arranged, so that the damping device 20, in the embodiment described here, comprises the layers 21 and 22, which are each formed by a damping material, in particular an adhesive. The conductor tracks 4, 4a, 4b are thus embedded between these two layers 21 and 22. Above the layer 22, in turn, an upper base body 10' corresponding to the lower base body 10, formed by an appropriate carrier material 11', in particular a laminate, is provided.

The manufacturing of the conductor path structure 1 is in turn carried out in accordance with the first exemplary embodiment, so that it does not have to be described in detail: The layer 21 of the damping adhesive is applied onto the carrier material 1 of the lower base body 10. The conductor tracks 4, 4a, 4b are then arranged thereon. The layer 22 made of a damping material is applied and subsequently the carrier material 11' of the upper main body 10'. Of course, it can be provided that in the second exemplary embodiment, layers not shown in the Figures, corresponding to the layers 31 of the first exemplary embodiment carrier material 11 and the layer 21 and/or between the layer 22 and the carrier material 11' of the upper main body 10' can be provided.

Figure 6:
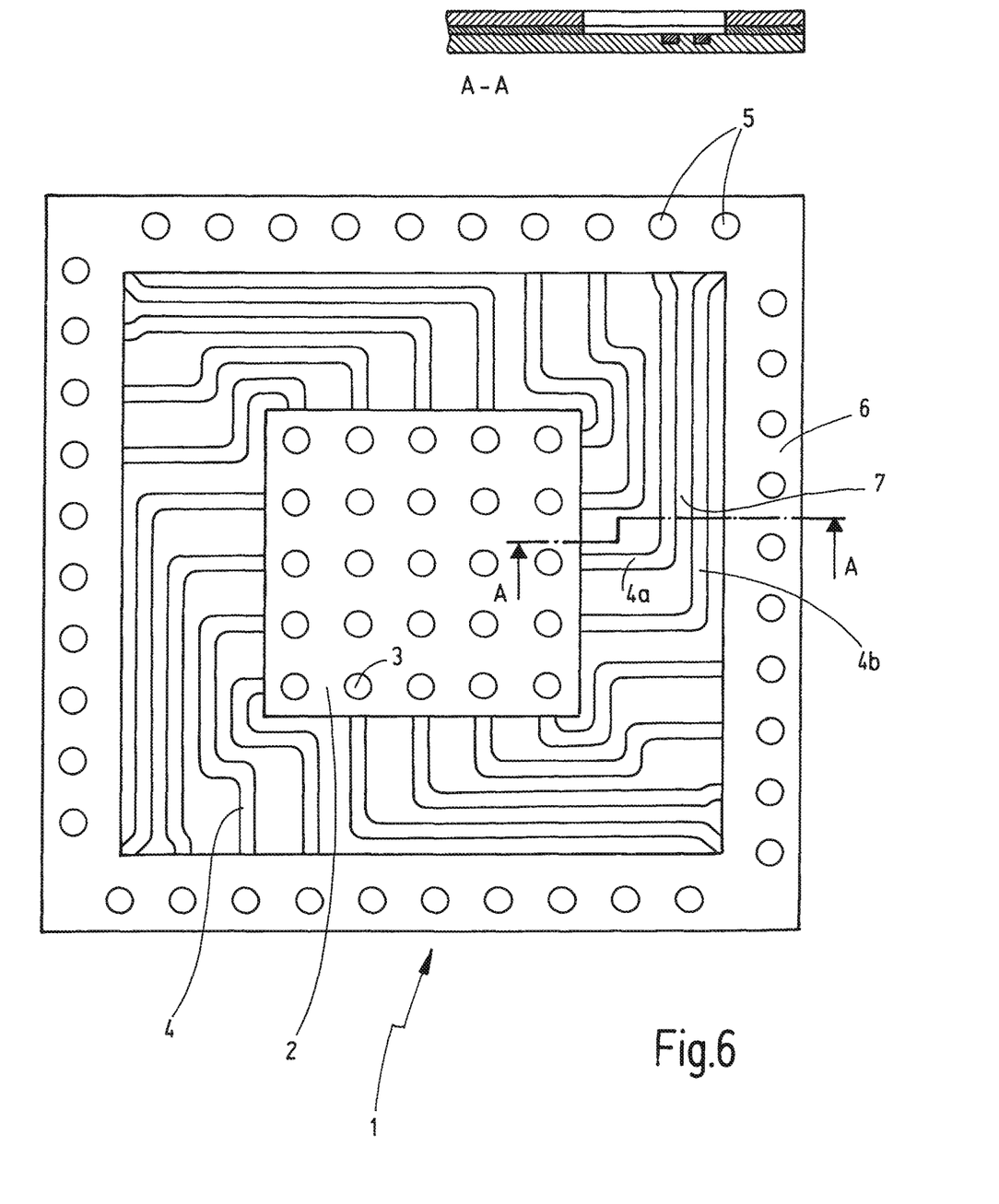
FIG. 6 is a third exemplary embodiment of a conductor path structure.
Figure 7:
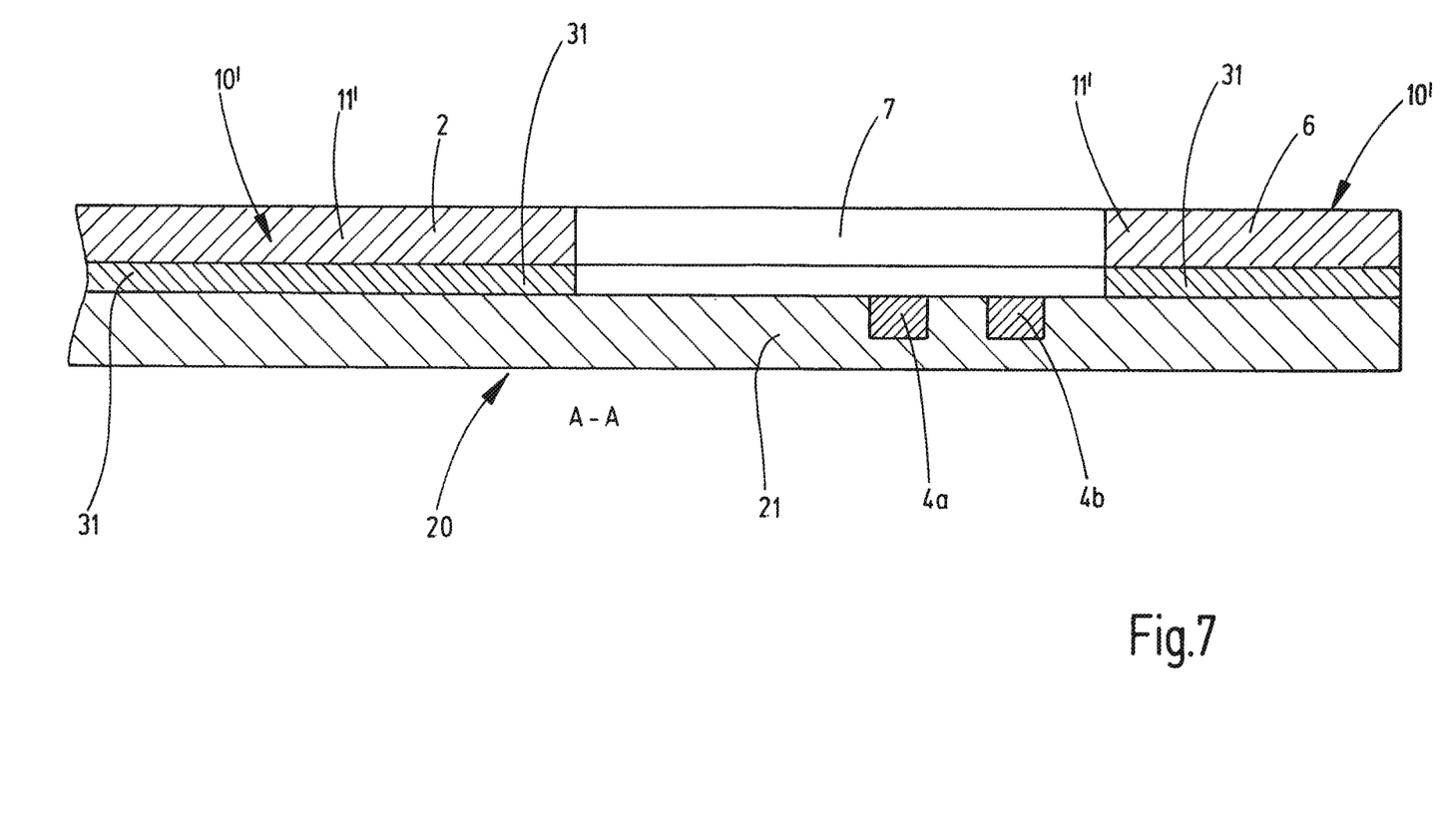
FIG. 7 is an enlarged representation of a section through the third embodiment along the line A-A.

FIGS. 6 and 7 now show a third exemplary embodiment of a conductor structure 1, wherein corresponding components are again provided with the same reference symbols and are no longer described in more detail. The third exemplary embodiment corresponds in its basic design to the first exemplary embodiment. It can be seen from the top view of FIG. 6, 4a, 4b that the conductor tracks 4, 4a, 4b are arranged exposedly.

The base body 10' of the third exemplary embodiment corresponds in its structure to the base body 10' of the first exemplary embodiment, so that the layer 31 made of a rigid adhesive is arranged under the upper layer made of a suitable carrier material 11', which is forming the cover layer of the conductor path structure 1. The conductor tracks 4, 4a are arranged below said layer 31, 4b, thus "hanging" under the layer 31. The layer 21 of the damping material is then applied onto the layer 31 of the base body 10', which forms the intrinsic damping device 20. These measures allow to form the layer 21, which in this embodiment provides the intrinsic damping device 20, extending over a large area, onto the base body 10 of the conductor path structure 1 for example by a dispensing process. This simplifies the production of such a conductor path structure 1 with an intrinsic damping device 20.

In the third exemplary embodiment of FIGS. 6 and 7, it is now again provided, that between the layer 21 and the carrier material 11' of the base body 10'—a layer 31 made of a rigid adhesive is provided. In this case it is once more true that this layer 31 serving for reinforcing the conductor path structure 1 can be omitted if for forming the layer 31 a damping adhesive is used, which has got sufficiently great adhesion properties in order to achieve a reliable connection with the material of the base body 10.

The production of the conductor path structure 1 is carried out in a manner that firstly the upper main body 10' with the carrier material 11' and the layer of rigid adhesive 31 is formed, and then, on this layer 31 of rigid adhesive, the conductor tracks 4, 4a, 4b are arranged. The layer 21 of damping material in particular of a damping adhesive, is then applied over a large area.

Figure 8:
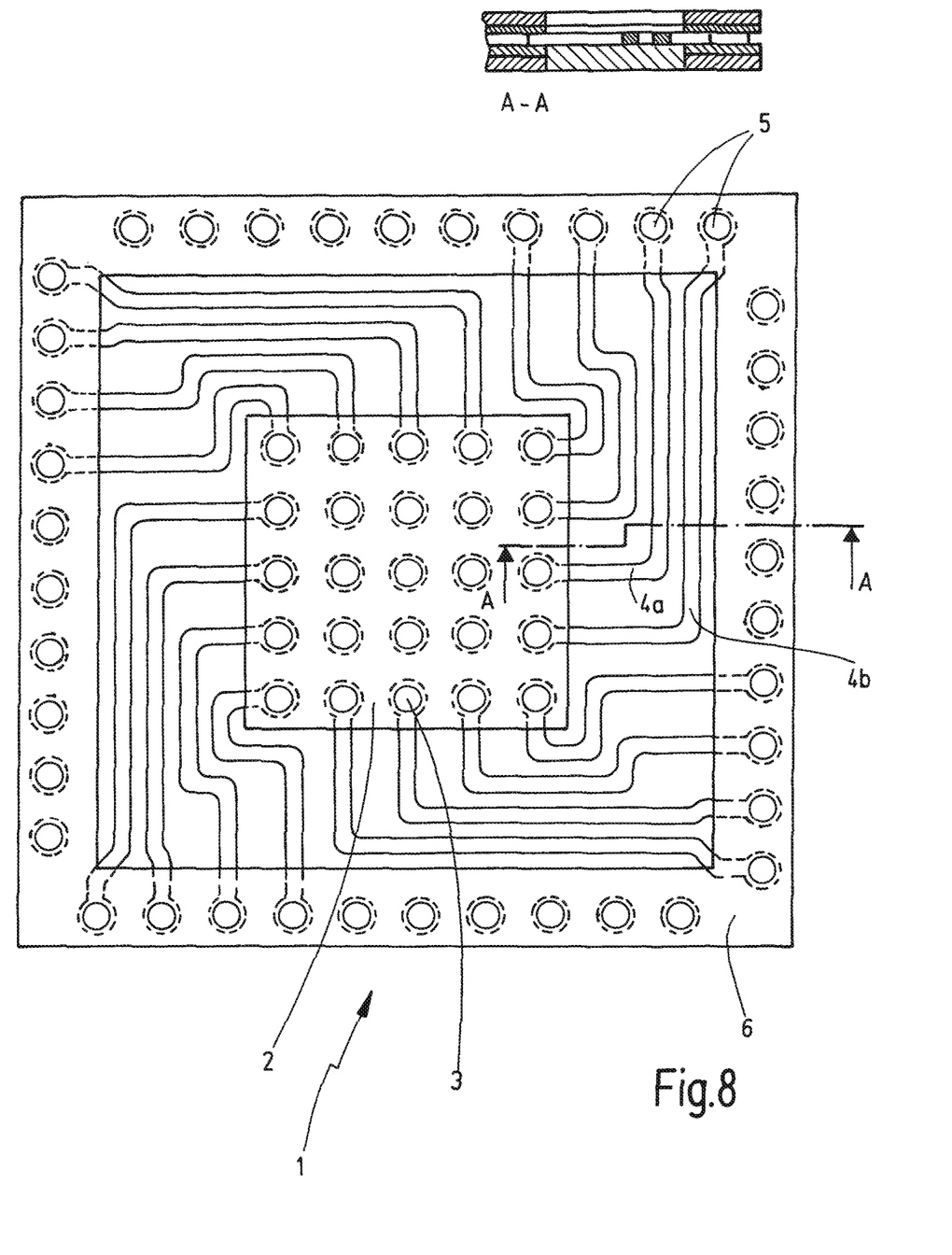
FIG. 8 is a fourth exemplary embodiment of a conductor path structure'
Figure 9:
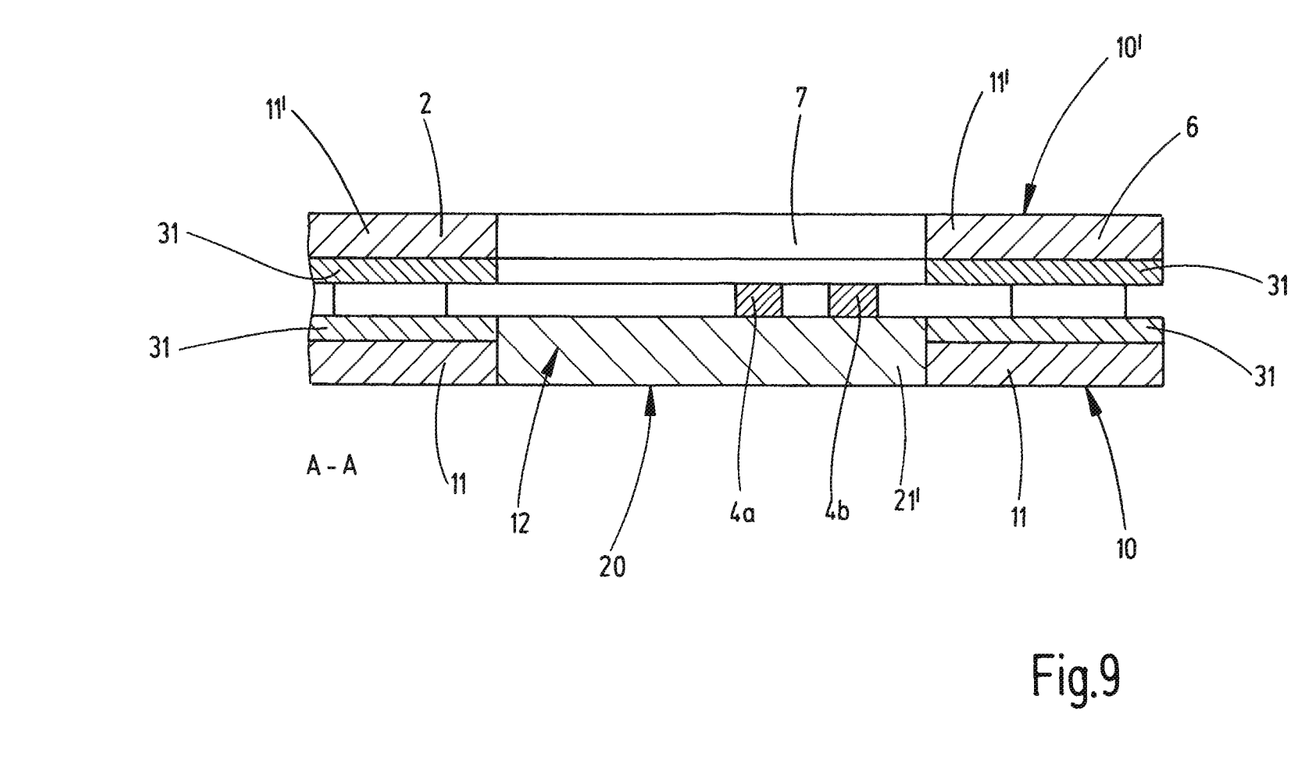
FIG. 9 is an enlarged representation of a section through the fourth embodiment along the line A-A.

In FIGS. 8 and 9, a fourth exemplary embodiment of a conductor path structure 1 is shown, whereby once more components corresponding to one another are provided with the same reference symbols and are no longer described further.

The fourth exemplary embodiment corresponds to the third exemplary embodiment, with the provision that the layer 21 made of damping material, in particular made of an adhesive, is applied—as in the third exemplary embodiment—over a large area, but in the configuration of local pads ("pads") 21' made of a damping material, in particular of an adhesive.

To this end, it is provided that the carrier material 11 of the lower base body 10 of the conductor path structure 1 has at least one recess 12, into which the aforementioned local pads 21' are then arranged. This can be achieved by inserting already prefabricated local pads or by locally applying the layer 21 of the damping material.

Alternatively, it is possible that the upper base body 10', instead of the lower basic body 10, has at least one such recess 12, into which the aforementioned local pad 21' is then arranged. The lower base body 10 can then optionally be omitted. Of course, a combination of these measures is also possible, that both the base body 10 and the base body 10' have at least one corresponding recess 12.

Figure 10:
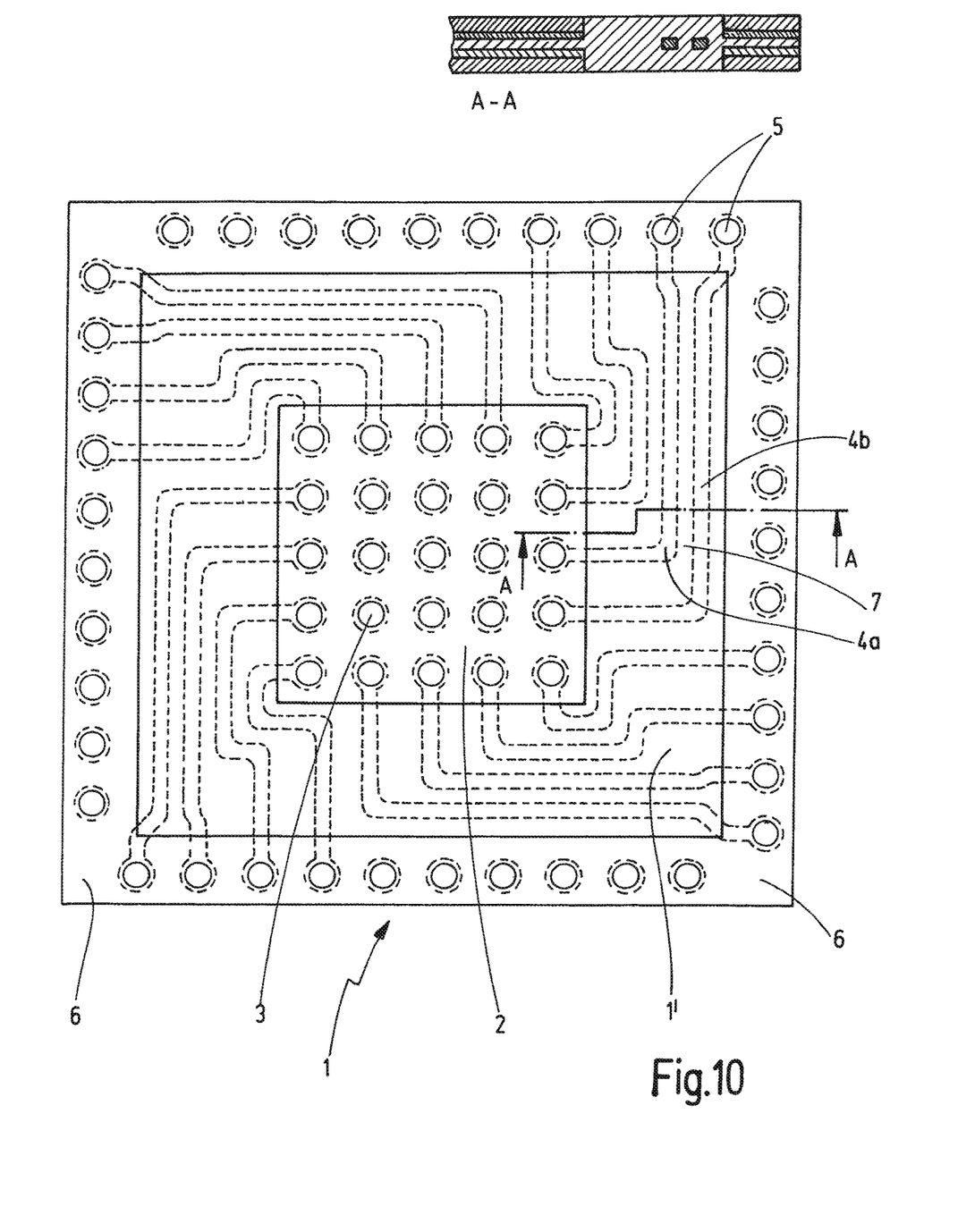
FIG. 10 is a fifth exemplary embodiment of a conductor path structure.
Figure 11:
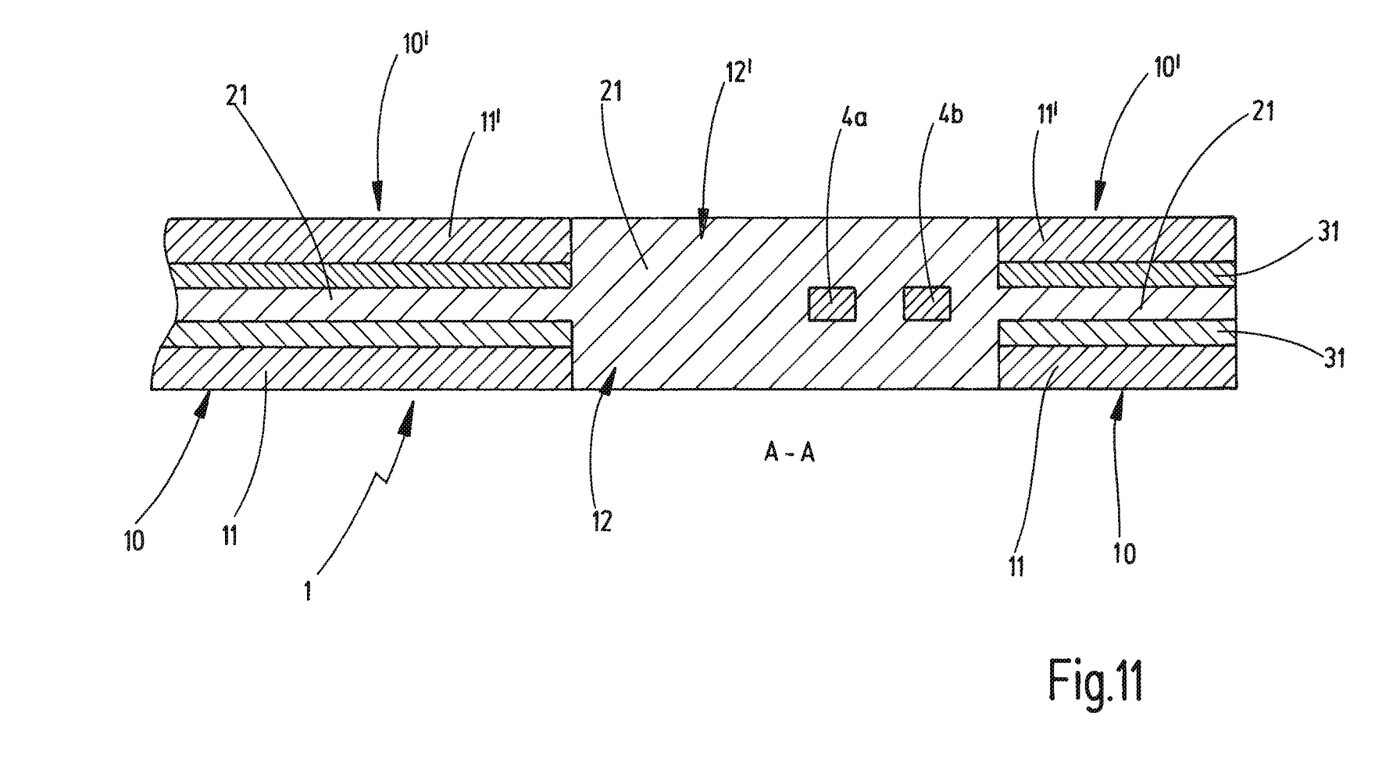
FIG. 11 is an enlarged representation of a section through the fifth embodiment along the line A-A.

A fifth exemplary embodiment of the conductor path structure 1 is shown in FIGS. 10 and 11, wherein once more corresponding components are provided with the same reference symbols and are no longer described further. The structure of the fifth exemplary embodiment essentially corresponds to the one of the fourth exemplary embodiment, the conductor path structure 1 thus has a closed surface 1', as it can be seen from the dashed-line representation of the conductor tracks 4, 4a, 4b. The lower base body 10 and the upper base body 10' each have a recess 12 and 12' respectively, which—as can best be seen from FIG. 11—are filled by a layer of damping material 21, in particular of a damping adhesive. The essential difference between the fourth and fifth exemplary embodiments is thus, that in the latter embodiment, instead of locally applied damping pads 21' a damping material, in particular a damping adhesive, is injected, printed or dispensed.

The conductor path structure 1 of the fifth exemplary embodiment is produced by means of a standard lamination technique. The conductor tracks 4, 4a, 4b and carrier films with adhesive layers are placed in a corresponding injection molding tool. In the closed injection molding tool, the shaping cavity in the area of the exposed conductor tracks in the area of the free space 7 is filled with damping material, which forms the layer 21. The lamination of the carrier layers onto the conductor tracks 4, 4a, 4b can be carried out either as a process upstream of the aforementioned injection molding process as well as during the injection molding process in the injection molding tool.

In summary, it is to be stated that, by means of the described measures, a conductor path structure 1 comprising an intrinsic damping device 20 is provided, which is distinguished by its simple and thus cost-effective producibility. It is now not required any longer that, for forming the intrinsic damping device 20, to cut-out respective sections of the lower base body 10 and/or the upper base body 10', which are then connected by an elastically resilient device for forming the oscillation and/or vibration damped connection area 2. Rather, it is provided that the intrinsic damping device 20 is formed by one or more layers 21, 22 made of a damping material, in particular a damping adhesive. Such a measure has the further advantage, that the conductor path structure 1 provided with the described damping device 20 is distinguished by a low overall height.

What is claimed is:

1. A conductor path structure having a damping device for an oscillation-damped and/or vibration-damped electronic component, an oscillation-damped and/or vibration-damped electromechanical component or an oscillation-damped and/or vibration-damped micromechanical component, wherein the conductor path structure has a first base body made of a carrier material comprising a connection area for receiving the oscillation-damped and/or vibration-damped component, the connection area being arranged separated from an area of the first base body surrounding it and being arranged oscillation-damped and/or vibration damped and co-acting with an intrinsic damping device of the conductor path structure, wherein the conductor path structure comprises a second base body arranged at a distance under the first base body, wherein above the second base body of the conductor path structure at least one layer made of a damping material is provided, wherein the intrinsic damping device formed by said at least one layer is arranged between the connection area of the first base body and the area of the second base body arranged below the connection area, wherein the oscillation-damped and/or vibration-damped component is arranged on the connection area and said connection area is separated from directly touching the first base body thereby providing an oscillation-damping and/or vibration-damping.

2. The conductor path structure according to claim 1, wherein the material forming the at least one layer made of a damping material is a damping adhesive.

3. The conductor path structure according to claim 1, wherein below the upper base body at least one further layer of the intrinsic damping device is provided, which is made of a damping material.

4. The conductor path structure according to claim 3, wherein the material forming the at least one further layer is a damping adhesive.

5. The conductor path structure according to claim 1, wherein for forming the intrinsic damping device the at least one layer made of the damping material is applied onto an upper side of the second base body and/or a bottom side of the first base body.

6. The conductor path structure according to claim 1, wherein the conductor path structure is arranged onto or in the at least one layer made of the damping material of the intrinsic damping device.

7. The conductor path structure according to claim 1, wherein at least one layer made of a rigid adhesive is provided on at least one base body.

8. The conductor path structure according to claim 1, wherein the conductor path structure is made by a lamination technique.

9. An oscillation-damped and/or vibration-damped conductor path structure, comprising:
   a lower base body;
   a damping material disposed on and above the lower base body;
   an upper base body disposed above the damping material, the upper base body surrounding a free space formed within the upper base body;
   a connection area arranged on the damping material, the connection area disposed within the free space of the upper base body, wherein the connection area is not directly attached to the upper base body but is spaced apart from the upper base body; and
   a component arranged on the connection area, wherein the connection area is separated from directly touching the upper base body thereby providing an oscillation-damping and/or vibration-damping through the damping material; and wherein the component comprises an electromechanical component, a micromechanical component or an electronic component.

* * * * *